United States Patent [19]
Kusano

[11] 4,030,036
[45] June 14, 1977

[54] BANDWIDTH CHANGING CIRCUIT

[75] Inventor: Kazutoshi Kusano, Mitaka, Japan

[73] Assignee: Sansui Electric Co., Ltd., Tokyo, Japan

[22] Filed: May 25, 1976

[21] Appl. No.: 689,948

[30] Foreign Application Priority Data
May 28, 1975 Japan ............. 50-71927[U]

[52] U.S. Cl. .............. 325/427; 325/490; 325/344; 325/408; 325/387; 330/126; 179/15 BT

[51] Int. Cl.$^2$ .......................... H04B 1/16

[58] Field of Search ......... 325/427, 490, 36, 399, 325/383, 408, 387, 462, 488, 489, 344; 178/DIG. 3; 179/15 BT; 330/126

[56] References Cited
UNITED STATES PATENTS

| | | | |
|---|---|---|---|
| 2,969,459 | 1/1961 | Hern | 325/344 |
| 3,633,119 | 1/1972 | Balbes | 325/490 |
| 3,904,948 | 9/1975 | Brinegar | 325/427 |
| 3,991,374 | 11/1976 | Csicsatka et al. | 325/427 |

Primary Examiner—Benedict V. Safourek
Assistant Examiner—Tommy P. Chin
Attorney, Agent, or Firm—Harris, Kern, Wallen & Tinsley

[57] ABSTRACT

A bandwidth changing circuit comprising first and second transistors connected in differential configuration, a narrowband filter whose output is connected to an input electrode of the first transistor, and a switching circuit. The switching circuit is responsive to a wideband designation voltage signal from a control voltage source to couple a wideband input signal source to an input electrode of the second transistor, and is responsive also to a narrowband designation voltage signal to couple the wideband input signal source to the input of the narrowband filter. The second transistor is biased normally conductive, while the first transistor is biased nonconductive in response to application of the wideband designation voltage signal to the input electrode thereof and biased conductive also in response to the narrowband designation voltage, thereby constituting a differential amplifier circuit together with the second transistor. The output of the bandwidth changing circuit is taken from an output electrode of the second transistor.

5 Claims, 2 Drawing Figures

BANDWIDTH CHANGING CIRCUIT

BACKGROUND OF THE INVENTION

This invention relates to a bandwidth changing circuit which may be used in FM receivers.

In the FM broadcasting, the bandwidth required for stereo broadcasting is different from that required for monaural broadcasting. In the former broadcasting, the required bandwidth is about 260 KHz, while in the latter broadcasting the required bandwidth is about 180 KHz. For this reason, the intermediate frequency bandwidth required for a stereo receiver is different from that required for a monaural receiver, but in any case the wider the intermediate frequency bandwidth, the higher the fidelity with which reception and reproduction are achieved. But, when, in case interference signals such as other broadcasting signals having a frequency approximate to a wanted signal frequency exists, the intermediate frequency bandwidth is wide, the interference signals sometimes enter into the intermediate frequency band to interrupt good quality of reception and reproduction due to the resulting beat interference.

For the above-mentioned reason, an FM receiver is provided with a bandwidth changing circuit for switching the intermediate frequency band from wideband to narrowband.

A conventional bandwidth changing circuit comprises a wideband signal path and a narrowband signal path including a narrowband filter which are arranged between a front end as a wideband signal source and an intermediate frequency amplifier stage, and a switching means for selectively coupling the wideband signal path or narrowband signal path between the front end and the intermediate frequency amplifier stage.

The amplitude level of an intermediate frequency signal when it passes through the wideband signal path is required to be substantially the same as that of the signal when it passes through the narrowband signal path. It is necessary, therefore, to provide on the narrowband signal path an amplifier for compensating the insertion loss of the narrowband filter, or alternatively to provide an attenuator on the wideband signal path. In the above-mentioned conventional bandwidth changing circuit, it is difficult to make its output impedance at selection of the wideband operation the same as the output impedance at selection of the narrowband operation.

SUMMARY OF THE INVENTION

Accordingly, it is an object of the invention to provide a bandwidth changing circuit capable of making the output impedance at wideband selection substantially the same as output impedance at narrowband selection.

It is another object of the invention to provide a bandwidth changing the circuit capable of making the output amplitude level of a passing signal at wideband selection substantially the same as the amplitude level of the at narrowband selection.

It is still another object of the invention to provide a bandwidth changing circuit simple in construction and suitable to an FM receiver.

DESCRIPTION OF THE PREFERRED EMBODIMENT

Figure 1:
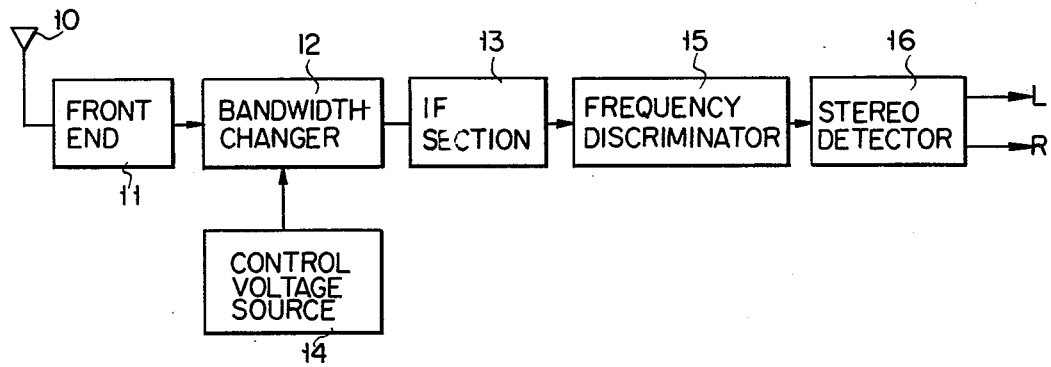
FIG. 1 is a schematic block diagram of an FM stereo receiver including a bandwidth changing circuit in accordance with the invention.

Referrring to FIG. 1, a reference numeral 10 denotes an antenna for receiving a frequency-modulated carrier. The carrier received by this antenna is applied to a known front end 11 for RF amplification and frequency conversion to produce an intermediate frequency FM signal having an intermediate frequency of 10.7 MHz. In the case of the stereo broadcasting, the intermediate frequency FM signal has a wide bandwidth of about 260 KHz. This wideband intermediate frequency FM signal is supplied to a known IF section 13 including intermediate frequency amplifiers and an amplitude limiter through a bandwidth changing circuit 12. This circuit 12 includes, as later described, a wideband signal path and a narrowband signal path including a narrowband filter, and operates in such a manner that when no interference signals exist, it receives a wideband designation voltage signal from a control voltage source 14 to couple the wideband intermediate frequency FM signal from the front end 11 to the IF section 13 through the wideband signal path, whereas when the interference signals exist, it receives a narrowband designation voltage signal to couple the wideband intermediate frequency FM signal to the IF section 13 through a narrowband signal path. In the bandwidth changing circuit 12 according to the invention, as later described, the output amplitude level of the intermediate frequency FM signal is not varied between when passing through the wideband signal path and when passing through the narrowband signal path. Further, whichever signal path is connected between the front end 11 and the IF section 13, the output impedance of the bandwidth changing circuit 12 does not vary. The output from the IF section 13 is coupled to a known frequency discriminator 15 and then to a stereo detector 16 to provide stereophonically related audio signals L and R.

A bandwidth changing circuit according to an embodiment of the invention is hereinafter explained by reference to FIG. 2. The bandwidth changing circuit arrangement of the invention is essentially composed of a switching circuit including switching elements, a narrowband filter, a differential amplifier circuit including at least one pair of transistors, a wideband input signal source, and a control voltage source.

The front end 11 as the wideband input signal source is connected through a capacitor C1 and a diode D1 with illustrated polarity in the order mentioned to the input of a narrowband filter NF whose output is connected to the base electrode of a first transistor Q1 and which has a bandwidth of, for example, 150 KHz centered at 10.7 MHz. It will be noted that this bandwidth is much narrower than that required for the FM stereo braodcasting. The junction between the capacitor C1 and the diode D1 is connected through a diode D2 with illustrated polarity and a capacitor C2 to the base electrode of a second transistor Q2 and is connected to circuit ground through a resistor R1.

The control voltage source 14 is connected to the base electrode of the first transistor Q1 through a resistor R2, and simultaneously connected also to circuit ground through a capacitor C3. The junction between the diode D2 and the capacitor C2 is connected to the control voltage source 14 through a diode D3 with illustrated polarity, and simultaneously connected also to the circuit ground through a resistor R3. The input of the narrowband filter NF is connected to the control voltage source 14 through a diode D4 with illustrated polarity and simultaneously connected also to the circuit ground through a resistor R4. To the diodes D3 and D4 are connected in parallel resistors R5 and R6. The base of the first transistor Q1 is connected to circuit ground through a resistor R7. The collector of the first transistor Q1 is directly connected to a DC voltage supply (+12V), while the emitter thereof is connected to the emitter of the second transistor Q2 through resistors R8 and R9. The junction between the resistors R8 and R9 is connected to circuit ground through a resistor R10. The collector of the second transistor Q2 is connected to the DC source through a resistor R11 and simultaneously connected also to the IF section 13 through output terminal. The base of the second transistor Q2 is connected to the DC source through a resistor R13, whereby the second transistor Q2 is biased normally conductive.

The above-mentioned control voltage source 14 comprises a positive DC source (+12V), a negative DC source (−12V) and a manual switch S for selectively providing the positive and negative DC voltages to the bandwidth changing circuit 13.

The operation of the foregoing bandwidth changing circuit will now be explained. In the case of the wideband operation, the manual switch S is so changed over as to apply a wideband designation voltage of −12lV to the bandwidth changing circuit 13. At this time, current flows from circuit ground to the control voltage source 14 by way of the resistor R1, diode D2 and resistor R5 in the order mentioned, so that the diode D2 is switched on.

The diode D3 is reverse-biased nonconductive due to voltage drop across the resistor R5. Further, since current flows from circuit ground to the control voltage source 14 by way of the resistor R4 and the diode D4 in the order mentioned, the diode D4 is switched on. Accordingly, since the potential at the junction a between the diode D4 and resistor R4 to which the anode of the diode D1 is connected decreases nearly to the potential at the point b to which the control voltage source 14 is connected, namely to the level of −12V, and the potential at the junction point c to which the cathode of the diode D1 is connected becomes higher than the potential at the connection point a, a diode D1 is switched off. At this time, the transistor Q1 is biased to cutoff in response to application of the wideband designation signal of −12V to the base thereof. In this way, during the wideband operation, the output of the front end 11 is coupled to the input electrode of the second transistor Q2 through the wideband signal path comprised of the capacitor C1, diode D2 and capacitor C3. On the other hand, the narrowband filter NF and first transistor Q1 are completely out of circuit. During the wideband operation, the first and second transistors Q1 and Q2 do not operate as a differential amplifier but the second transistor Q2 operates as a buffer amplifier with negative feedback which has a small gain and an emitter resistance of R9 + R10.

On the other hand, during the narrowband operation, the manual switch S is so changed over as to apply a narrowband designation voltage of +12V to the bandwidth changing circuit 13. At this time, current flows from the control voltage source 14 to the circuit ground by way of the resistor R6, diode D1 and resistor R1 in the order mentioned to switch the diode D1 on. The diode D4 is reverse-biased by voltage drop across the resistor R6. Further, the diode D3 is switched on due to current flowing from the control voltage source 14 to the circuit ground through the diode D3 and resistor R3 in the order mentioned. As a result, the potential at the point d to which the anode of diode D2 is connected becomes substantially equal to the potential at the point b to switch the diode D2 off. On one hand, when the voltage of +12V is applied to the base electrode of the first transistor Q1, the base bias voltage of the first transistor Q1 becomes equal to that of the second transistor Q2 in accordance with the relationship of R7/R2=R13/R12. Accordingly, the first transistor Q1 constitutes a differential amplifier together with the second transistor Q2. The base electrode of the second transistor Q2 is connected in terms of alternating current to circuit ground through the capacitor C2, diode D3 and capacitor C3 owing to the diode D3 being kept on. In the case of the narrowband operation, accordingly, the front end 11 is coupled only to the base of the first transistor Q1 through the narrowband filter NF owing to the diode D1 being kept on. In this case, since the second transistor Q2 operates as a common-base amplifier, the differential amplifier including the first and second transistors Q1, Q2 has its voltage gain suppressed to operate as an amplifier for compensating the insertion loss of the narrowband filter NF.

For this reason, the voltage gain for a wideband input signal supplied to the transistor Q2 during the wideband operation can be made nearly equal to that for a narrowband input signal supplied to the transistors Q1, Q2 during the narrowband operation. Further, since both the wideband input signal and the narrowband input signal are supplied to the next stage circuit through the second transistor Q2, the output impedance of the bandwidth changing circuit during the wideband operation can be made equal to that of the bandwidth changing circuit during the narrowband operation.

Figure 2:
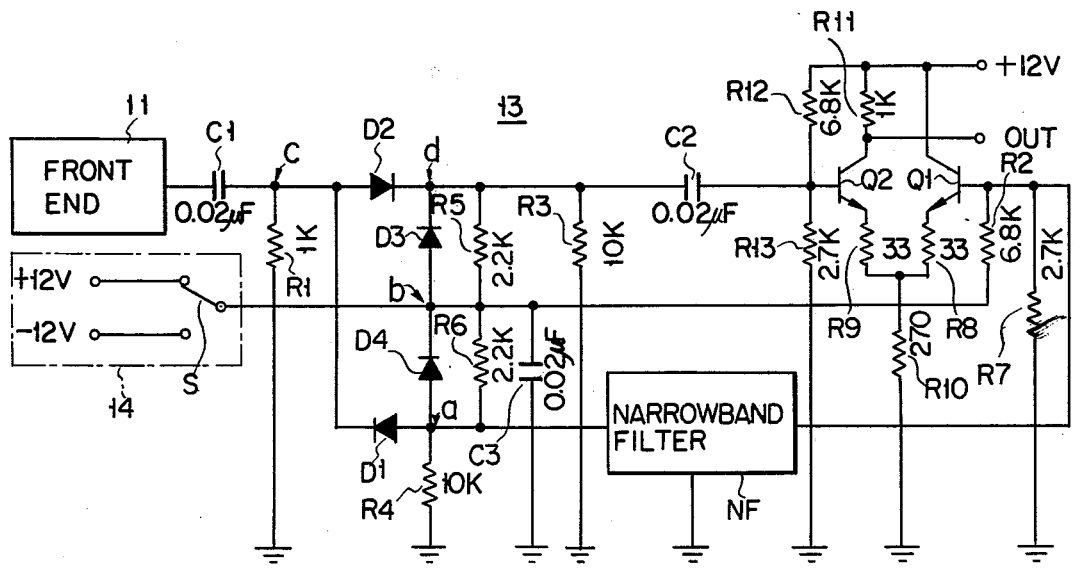
FIG. 2 is a schematic circuit diagram of the bandwidth changing circuit according to an embodiment of the invention.

In the embodiment of FIG. 2, the wideband and narrowband operations are manually changed. But, it is also possible to automatically effect changing operation in accordance with the beat component produced due to the existence of interference signals. This automatic system can be realized by amplitude detecting the intermediate frequency FM signal to detect the beat component and then controlling a Schmitt circuit to supply, in the case of the beat component being existent, the narrowband designation voltage, and in the case of the beat component being non-existent, the wideband designation voltage, to the bandwidth changing circuit, or by filtering the output of the frequency discriminator to take out the beat component and then amplitude detecting this beat component to controll the Schmitt circuit as mentioned above.

What is claimed is:
1. A bandwidth changing circuit comprising:
 a differential amplifier circuit means including first and second inputs and first and second transistors having input electrodes connected to said first and second inputs respectively and connected in differential configuration to each other, said second input being coupled to a power source to bias said second transistor conductive;

a control voltage providing means for selectively providing first and second control voltages having different voltage levels to said first input of said differential amplifier circuit means, thereby causing, upon provision of the first control voltage, said first transistor to be biased conductive to constitute a differential amplifier circuit together with said second transistor and causing, upon provision of the second control voltage, said first transistor to be biased nonconductive;

a wideband input signal source;

a narrowband filter having an output coupled to said first input of said differential amplifier circuit means; and a switching circuit means for coupling, when said control voltage providing means provides the second control voltage to said first input of said differential amplifier circuit means, said wideband input signal source to said second input of said differential amplifier circuit means in response to said second control voltage, and coupling, when said control voltage providing means provides the first control voltage to said first input of said differential amplifier circuit means, said wideband input signal source to said first input of said differential amplifier circuit means through said narrowband filter in response to said first control voltage.

2. A bandwidth changing circuit according to claim 1, which further comprises means for causing, when said wideband input signal source is coupled to said first input of said differential amplifier circuit means, the AC potential of the input electrode of said second transistor to become circuit ground potential.

3. A bandwidth changing circuit according to claim 1, wherein said switching circuit means includes switching diodes.

4. A bandwidth changing circuit according to claim 1, wherein said control voltage providing means includes a manual switch for selecting the first and second control voltages.

5. A bandwidth changing circuit according to claim 1, wherein said wideband input signal source includes a front end of an FM receiver.

* * * * *